US008456816B2

(12) United States Patent
Hirota

(10) Patent No.: US 8,456,816 B2
(45) Date of Patent: Jun. 4, 2013

(54) STRUCTURE ASSEMBLED TO PANEL

(75) Inventor: Hideyuki Hirota, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 216 days.

(21) Appl. No.: 13/143,105

(22) PCT Filed: Dec. 15, 2009

(86) PCT No.: PCT/JP2009/006879
§ 371 (c)(1),
(2), (4) Date: Jul. 1, 2011

(87) PCT Pub. No.: WO2010/106602
PCT Pub. Date: Sep. 23, 2010

(65) Prior Publication Data
US 2011/0267750 A1 Nov. 3, 2011

(30) Foreign Application Priority Data
Mar. 19, 2009 (JP) ................. 2009-068266

(51) Int. Cl.
*G06F 1/16* (2006.01)
(52) U.S. Cl.
USPC ....... 361/679.01; 524/447; 248/454; 362/545
(58) Field of Classification Search
USPC ............... 455/575.1, 575.3, 556, 1, 575.9, 455/557; 524/103, 111, 291, 83, 102, 447, 524/424, 583, 130, 155, 101; 248/222.14, 248/222.41, 560, 454, 125, 1, 590, 629, 209, 248/309.1, 276.1, 96, 305, 449, 458, 213.2, 248/442.1; 174/72 A, 110 SY; 362/23.18, 362/293, 545; 361/679.01, 679.21, 679.22, 361/679, 23, 26, 679.27, 679.06, 679.48, 361/679.41, 679.58, 679.02, 679.03, 679.08, 361/679.31, 679.32, 679.33; 345/633, 8, 345/589, 617, 156, 158, 173, 690, 473
See application file for complete search history.

(56) References Cited

U.S. PATENT DOCUMENTS

| 5,430,612 A | 7/1995 | Simon et al. | |
|---|---|---|---|
| 2011/0248132 A1* | 10/2011 | Hirota | 248/222.14 |
| 2011/0249387 A1* | 10/2011 | U et al. | 361/679.21 |

FOREIGN PATENT DOCUMENTS

| DE | 4315027 A1 | 6/1994 |
|---|---|---|
| EP | 0167368 A2 | 1/1986 |
| JP | 7-251652 A | 10/1995 |
| JP | 3669113 B2 | 7/2005 |
| JP | 2005-308429 A | 11/2005 |

* cited by examiner

*Primary Examiner* — Hung Duong
(74) *Attorney, Agent, or Firm* — Birch, Stewart, Kolasch & Birch, LLP

(57) ABSTRACT

A structure assembled to a panel includes a panel 7, a hood 6, and a filter 5, and is arranged such that the hood 6 and the filter 5 are assembled to the panel 7 independently from each other by the engagement between resiliently engaging claws and engaging concavities.

6 Claims, 8 Drawing Sheets

STRUCTURE ASSEMBLED TO PANEL

TECHNICAL FIELD

The present invention relates to a structure assembled to a panel in an electronic apparatus having a display and operation buttons, the structure where a filter working as a display protecting component is assembled to the panel having an operation button housing section, and a hood is assembled to the panel so as to fill an opening formed between the panel and the filter.

BACKGROUND ART

An electric apparatus having a display or indicator and an operation button, and mounted on a moving body such as a motor vehicle, uses a filter for protecting a display screen of the indicator and modulating the display color thereof. In this case, the filter has a curved surface nonparallel to the display screen to suppress the reflection of outside light. Therefore, an opening is formed between the filter and the display screen. Thus, a hood for filling the opening is required.

Conventionally, a filter is gripped between a panel and a hood to assemble and fix the filter to the panel by thread fastening. However, the panel, the filter, and the hood normally come in contact with each other; thus, there are the following problems: rubbing is caused between the panel, the hood, and the filter due to the deformation or the like of the panel, and also the vibration and the impact of a moving body, to generate an abnormal noise; push buttons housed in an operation button housing section of the panel are vibrated to generate a sound; and further, thread fastening fixation for assembling and fastening the hood to the panel makes difficult the assembly and disassembly thereof.

Patent Document 1 discloses an optical filter attaching structure arranged such that a filter is assembled without screws.

PRIOR ART DOCUMENTS

Patent Documents

Patent Document 1: Japanese Patent No. 3669113

SUMMARY OF THE INVENTION

However, although the assembly and the disassembly of a filter is easy in the structure disclosed in Patent Document 1 because the filter is assembled without screws, there are problems such that the following matters are not improved: an abnormal noise is generated by the rubbing between the panel, hood, and filter assembled to each other; and operation buttons housed in an operation button housing section are vibrated to generate a sound.

The present invention has been made to solve the above-discussed problems, and an object of the invention is to achieve a structure assembled to a panel that enables a structure where the assembly and fixation of a hood and a filter to a panel can be performed without screws, and that also prevents the abnormal noise generated by the rubbing between the panel, the hood, and the filter, and the sound produced by the vibration of operation buttons.

A structure assembled to a panel according to the invention has the panel, a hood, and a filter, wherein the panel includes: a filter mounting section to be mounted on the inner side thereof by the filter covering a display screen of an display; a plurality of operation button housing sections; a rectangular opening engaging section and an engaging claw formed on an outer face of a top plate of the filter mounting section; and a resiliently engaging claw, and an engaging concavity that are formed on an outer face opposing the filter mounting section of each of the operation button housing sections, wherein the hood includes: an engaging hole for engaging with the resiliently engaging claw to the outer face of an upper frame of the filter mounting section; and an engaging protrusion for engaging with the engaging concavity that is provided in a lower frame thereof, and wherein the filter includes: a resiliently engaging claw for engaging with the rectangular opening engaging section on the outer face of the top plate of the filter mounting section at the edge of the upper end thereof; and an engaging claw for engaging with the resiliently engaging claw of the operation button housing section that are provided at the edge of the lower end thereof.

Also, the structure has the panel, a hood, and a filter, wherein the panel includes: a filter mounting section having mounted on the inner side thereof the filter having a curved surface nonparallel to a display screen of an display; a plurality of operation button housing sections provided below the filter mounting section; a rectangular opening engaging section and an engaging claw formed on an outer face of a top plate of the filter mounting section; and a resiliently engaging claw, a positioning concavity, and an engaging concavity that are formed on an outer face opposing the filter mounting section of each of the operation button housing sections, wherein the hood includes: a cover section for covering the rectangular opening engaging section and an engaging hole for engaging with the resiliently engaging claw that are provided on an outer face of an upper frame thereof to be assembled to the outer face of the top plate of the filter mounting section; and an engaging protrusion for engaging with the engaging concavity that is provided in a lower frame thereof, and wherein the filter is formed with a curved face to be disposed along the filter mounting section, and includes: a resiliently engaging claw for engaging with the rectangular opening engaging section of the outer face of the top plate of the filter mounting section that is provided at the edge of the upper end thereof; and an engaging claw and a positioning protrusion for engaging with the resiliently engaging claw and the positioning concavity of the operation button housing section, respectively, that are provided at the edge of the lower end thereof.

According to the present invention, the filter and the hood are assembled to the panel independently from each other by using the engagement between the engaging hole and the engaging claw. Thus, screw fixations can be reduced, the assembly and the disassembly are facilitated, thus enhancing the ability of those components to be recycled. Further, even if deformation or the like is caused in the panel, since the filter and the hood are assembled to the panel independently from each other, rubbing is not caused between the filter and the hood, and the area where both of the components come in contact with each other is minimized, thus restraining the generation of grating noise thereof.

Further, since it is arranged that the outer face of the upper frame of the hood assembled to the panel is pressed by the L-shaped drawing positioning sections that are formed on the outer face of the top plate of the filter mounting section, the detachment between the hood and the panel is prevented, to thus improve the engagement of the engaging claw and strengthen the engagement between the hood and the panel.

Moreover, resiliently pressing sections projecting at predetermined intervals so as to abut against the respective bottom faces of the operation buttons are formed on the outer face of the lower frame of the hood; thus, as the hood is assembled to the panel, the resiliently pressing section abuts against the lower face of the operation button housed in the operation button housing section of the panel. As a result, the operation button is normally upwardly forced by the resilient force of the resiliently pressing section to suppress the wobble of the operation button, thereby restraining the generation of an abnormal noise.

In this case, the resilient force acting on the operation button does not impart a large load to the extent of impairing the operating feel. The load is adjusted by the length and the thickness of the resiliently pressing section. Further, the position where the operation button is pressed is located substantially centrally of the operation button in consideration of the inclination and the off-center depression of the button.

BEST MODE FOR CARRYING OUT THE INVENTION

Embodiments of the present invention will now be described with reference to the accompanying drawings in order to explain the present invention in more detail.

First Embodiment

Figure 1:
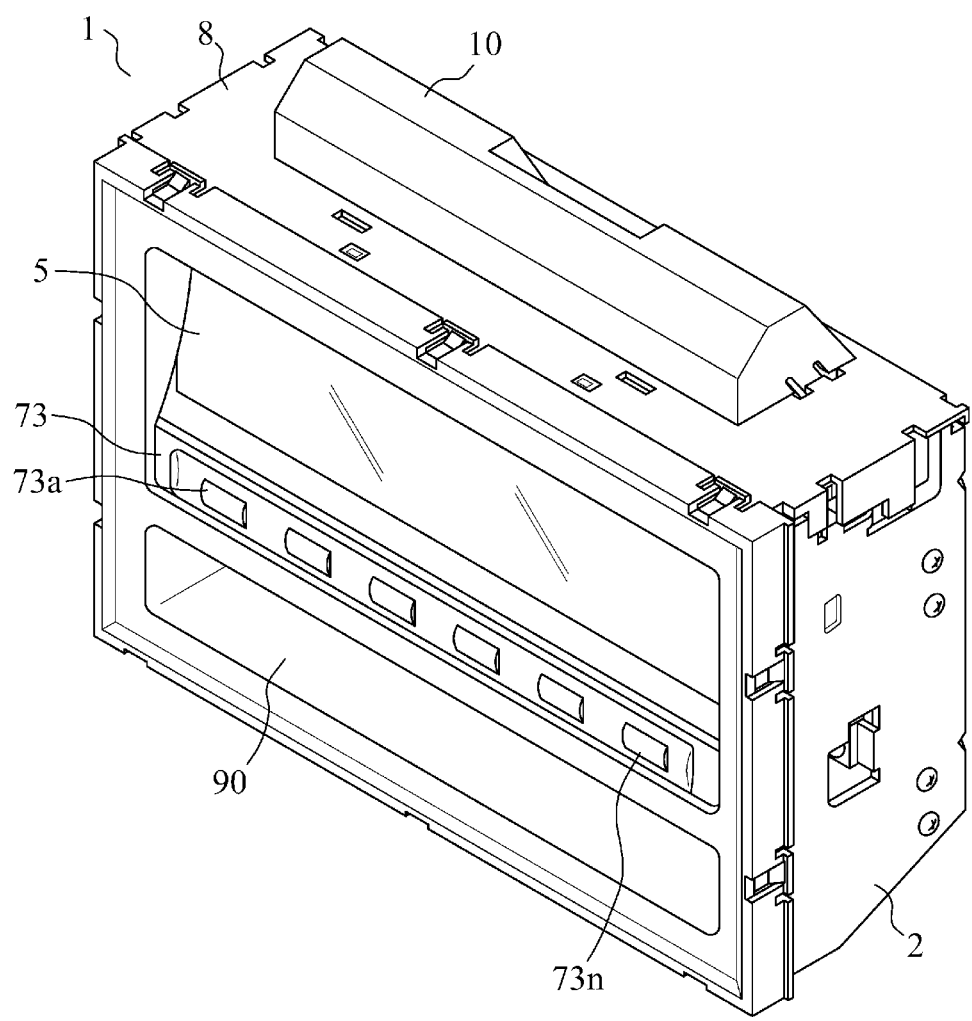
FIG. 1 is a schematic view of an electronic apparatus to which a structure assembled to a panel according to the present invention is applied.

In the following, a structure assembled to a panel according to the present invention will be described with reference to the drawings. First, the outline of an electronic apparatus to which the structure assembled to a panel according to the invention is applied will be discussed based on FIG. 1 and FIG. 2. An electronic apparatus 1 includes: a box-shaped and hollow chassis 2; a board 3 to be assembled to the interior of the chassis 2; a display 4 to be assembled to the board 3; a panel 7 to be assembled to the chassis 2, while a filter 5 disposed opposite the display 4 is attached thereto together with a hood 6; and a cover 8 for covering the opening of the chassis 2 after assembling all of the above parts. Note that in the following descriptions, expressions of "upper and lower side plates," "front and back side plates," and also "right and left side plates" are based on a state where the electronic apparatus is disposed at an in-service position.

The chassis 2 includes: a screw fixing section (also serving as a board receiver) 21 provided in the interior thereof; a first board receiving section 22 that is formed at the same height position as that of the screw fixing section (also serving as a board receiver) 21 by cutting and raising inwardly a portion of each side plate of the chassis 2; board gripping sections 23a, 23b (one of the sections is not shown) that are formed so as to grip the board 3 by cutting and raising inwardly another portion of each side plate of the chassis 2; a board assembling guide section 24 that is formed by folding a portion of the first board receiving section 22 at a substantially right angle toward the board mounting side; and a rectangular opening engaging section 25 formed by turning at a substantially right angle at the upper edge of the back side plate of the chassis 2 so as to engage with a protrusion 31 formed at the edge of the board that is not fixed by screws, and also a second board receiving section 26 that is formed by horizontally extending from each side of the rectangular opening engaging section toward the interior of the chassis and formed at the substantially same height position as those of the screw fixing section (also serving as a board receiver) 21 and the first board receiving section 22.

Further, the chassis 2 is formed of an L-shaped hooking section 27 formed by bending inwardly a portion of a cover mounting opening end of each side plate thereof; an assembly guide section 28 dimpling inwardly the side of the opening end of the chassis 2 by the thickness of the cover 8 in the vicinity of the hooking section 27; and a tapped hole 101 and an engaging hole 102 formed through the upper part of the back side plate thereof.

The display 4 has a rectangular shape with a certain thickness. A holder 9 for holding the display 4 assembled thereto is made of a resin material, and includes: resilient lugs 91 serving as an urging unit in the direction of thickness, and formed on the bottom face by cutting and raising a portion of the bottom face so as to urge the display 4 mounted thereon in the direction of thickness; resilient lugs 92 working as an urging unit in the downward direction, and formed by cutting and raising inwardly a portion of the upper side plate so as to urge the display 4 toward the terminal side; resilient lugs 93 working as a sandwiching unit, and formed by cutting and raising inwardly a portion of each of the right and the left side plates so as to sandwich the display 4 from right and left; and resiliently engaging claws 94 and 95 serving as a surface pressing unit, and formed on the upper side plate, and also the right and the left side plates so as to press the surface of the display 4.

Also, resiliently engaging claws 96 and 97 for assembling and fixing the holder 9 to the board 3 are formed on the back side plate and the right and left side plates of the holder 9 by extending in the direction of thickness. Further, engaging claws for engaging with holes of the board 3 are formed on the bottom face thereof; however, indications thereof will be omitted in FIG. 2.

The panel 7 includes an assembling wall 70 relative to the chassis 2 therearound, and has a display window 71 that is formed inside a predetermined distance away from the upper side plate forming the wall 70; a filter mounting section 72 formed in the shape of a frame on the fringe of the display window 71; an operation button housing section 73 for housing a plurality of operation buttons 73a to 73n that are formed along the lower edge of the filter mounting section 72; and a glove compartment 74 that is formed and positioned between the operation button housing section 73 and the lower side plate of the wall 70. The upper and the lower side plates and the right and the left side plates forming the assembling wall 70 are provided with rectangular opening engaging sections 70a for engaging with the engaging claws formed on the chassis 2.

The hood 6 is made of a resin material in the shape of a frame, and has cover sections 61 and engaging holes 62 on the upper frame side plate thereof that is assembled to the outer face of the upper side plate of the filter mounting section 72. Further, the hood 6 has on the lower frame side plate thereof resilient press sections 63 that are formed by projecting at a specific interval so as to abut against the bottom face of the operation buttons, and engaging projections for engaging with engaging concavities (see FIG. 13).

The filter 5 is formed with a curved face so as to conform to the filter mounting section 72. At the upper end edge of the filter, there is provided with hooking resiliently engaging claws 51 having a taper and formed at a specific interval so as to engage with rectangular opening engaging sections (see FIG. 3) of the panel 7; and concavities 54 formed at the positions with which the protrusions (not shown) formed in the filter mounting section 72 is engaged, while at the lower end edge thereof, there is provided with engaging claws 52 and positioning convexities 53 formed so as to engage with the resiliently engaging claws 75 and the positioning concavities 76 formed on the outer face of the operation button housing section 73, respectively.

In the cover 8, hooking claws 81 for engaging with the L-shaped hooking sections 27 of the chassis 2; and guide lugs 82 for engaging with the assembly guide sections 28 are formed in the cover 8, with extending from the upper end edge of each side plate of the cover in the assembling direction, and also the cover has a right-angularly bent lug 83 to be superposed on the outer face of the back side plate of the chassis 2; screw passing holes (not shown) opposed to the tapped holes 101 of the chassis; and engaging claws 85 for engaging with the engaging holes 102. It is preferable to provide a taper 85a on the engaging claw 85 such that the engaging claw easily engages with the engaging hole 102. Further, four corners of the engaging hole 102 are arranged to have a circular arc portion (not shown) and the circular arc portion is normally caused to come in contact with the engaging claw 85.

The engagement faces between the hooking section 27 and the hooking claw 81 are provided with tapers (not shown) such that the chassis 2 and the cover 8 impart a pressing force to each other, and the terminal portions of the tapers are formed in the shape of a circular arc (not shown). Further, the cover 8 includes engaging hole sections 86 formed by juxtaposing two holes 86a, 86b and resiliently engaging lugs formed by extending downwardly one side of the edges of a cut-raised hole 87.

On the other hand, in a case 10 assembled to the cover 8, substantially U-shaped resiliently engaging claws 11 also serving as a positioner to engage with the engaging hole sections 86 of the cover 8; and resiliently engaging claws 12 extending downward so as to pass through the cut-raised hole 87 of the cover 8 and normally engage with the lower end of the engaging lug 87a are formed at the opening end edge of the case 10 to be opposite thereto.

Figure 2:
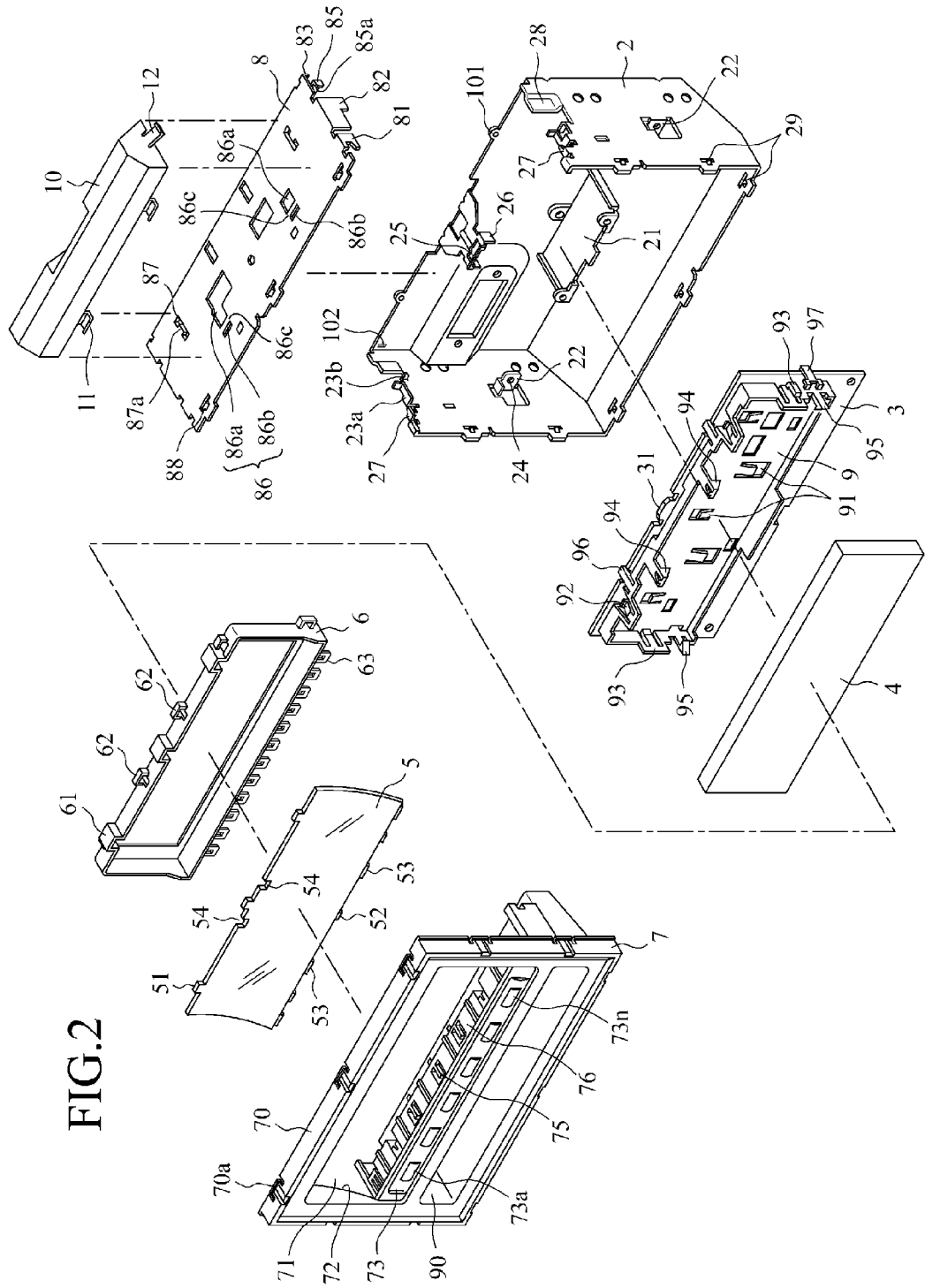
FIG. 2 is an exploded perspective view of the electronic apparatus.

In the following, assembly of the parts will be described. To assemble the display 4 to the holder 9, as the display 4 is pressed to the holder 9 from the top face thereof, the display 4 advances while outwardly pressing and widening the resilient lugs 92, the resilient lugs 93, and the resiliently engaging claws 94 and 95, and further advances while depressing the resilient lugs 91. Further, as the display 4 passes therethrough, the resilient lugs 92 urge the display 4 to a terminal side, the resilient lugs 93 sandwich the display 4 from right and left, and the resiliently engaging claws 94 and 95 press and maintain the face of the display 4 to be forced upwardly by the urging force of the resilient lugs 91, thus completing the assembly of the display 4 to the holder 9. After completing the assembly (the following processes may be performed before the assembly of the display), the holder 9 is assembled to the board 3 with the resiliently engaging claws 96 and 97, and the engaging claws of which indications are omitted, as shown in FIG. 2.

Then, the board 3 having the display 4 assembled thereto is mounted on the first board receiving sections 22 formed on each side plate of the chassis 2 to be moved in the assembling direction and be sandwiched at both side edges thereof by the board gripping sections 23a, 23b. At the movement terminated position, the board 3 is mounted on the second board receiving section 26 at the moving front end thereof, and the protrusion 31 formed at the end edge of the board that is not fixed by screws enters the rectangular opening engaging section 25. In this state, the board 3 is mounted on the screw fixing section (also serving as a board receiver) 21 at the back end side thereof to be fixed by screws.

On the other hand, to assemble the cover 8 to the opening of the upper face of the chassis 2, the guide lug 82 of the cover 8 is moved along the assembly guide section 28 of the chassis 2 to cause the cover 8 to abut against the opening end of the chassis 2, thus preventing the cover 8 drawn too much to the chassis side to be lowered.

Next, the cover 8 is moved until the right-angularly bent lug 83 abuts against the outer face of the back sideplate of the chassis 2 in a state where the cover is abutted against the opening end face thereof to thereby engage the hooking section 27 with the hooking claw 8, and then adjust these lateral and vertical positions to be in mesh with each other. In this case, since the hooking section 27 and the hooking claw 81 are formed with a taper such that an entrance thereof widen and a root thereof narrow, the hooking section and the hooking claw are easily combined to each other, and also they can be firmly secured to each other in the combined state. Further, by providing circular arc portions at the roots of the hooking section 27 and the hooking claw 81, respectively, the hooking section 27 and the hooking claw 81 are caused to normally come in contact with each other, thus enabling the two engaging members to be maintained at tension.

Further, as the right-angularly bent lug 83 of the cover 8 is abutted against the outer face of the back side plate of the chassis 2 to be superposed, the engaging claw 85 formed at the right-angularly bent lug 83 engages with the engaging hole 102 of the back sideplate of the chassis 2, and thereby the cover 8 is positioned and held to the chassis 2. Therefore, while maintaining this state, a screw (omitted in FIG. 2) passed through the screw passing hole of the right-angularly bent lug 83 is screwed into the tapped hole 101 of the chassis 2 to be screw-fixed. In this case, the engaging claw 85 has the taper, and the four corners of the engaging hole 102 are formed with a circular arc portion. Thus, the engaging claw 85 is easily inserted into the engaging hole 102, the engaging claw 85 is normally in contact with the corner of the circular arc portion of the engaging hole 102, and the back plate of the chassis 2 is gripped between the cover 8 and the engaging claw 85, thus enabling the cover and the chassis to be maintained at tension.

On the other hand, to assemble the filter 5 to the panel 7, as the hooking engaging claw 51 of the filter 5 is first engaged with the rectangular opening engaging section 70a of the panel 7 to press the side of the lower end of the filter against the one of the panel, the resiliently engaging claw 52 engages with the engaging claw 75 on the side of the panel in this process, and also the positioning convexity 53 engages with a positioning concavity (omitted in FIG. 2) on the side of the panel, thus assembling the filter 5 to the panel 7.

After assembling the filter, the peripheral portion of the hood 6 is fitted in an L-shaped drawing positioning section 74 (see FIG. 9) on the side of the panel such that the peripheral portion of the filter is covered, and engaging claws 77 (see FIG. 12) on the side of the panel are engaged with the engaging holes 62. This assembly causes the cover sections 61 to cover rectangular opening engaging sections 78 (see FIG. 3) located on the side of the panel, and the resilient pressing sections 63 abut against the bottom faces of the operation buttons 73a to 73n to impart a restoring force to the operation buttons.

The wall 70 of the panel 7, to which the filter 5 and the hood 6 have been thus assembled, is fitted in the front opening of the chassis 2 having the board 3 assembled thereto as discussed above, and cut-raised engaging claws 29 formed on the chassis 2, and cut-raised engaging claws 88 of the cover 8 are engaged with the rectangular opening engaging sections formed on the wall 70, thus completing the assembly of the electronic apparatus 1.

Moreover, before the assembly or after the completion of the assembly as mentioned above, the case 10 is assembled and fixed to the cover 8. In this case, the substantially U-shaped resiliently engaging claws 11 of the case 10 are inserted from the holes 86a located in the upper face of the cover 8, further the case 10 is rotated from this state to the side of the cover 8 to thereby insert the tip portions of the resiliently engaging claws 11 into the holes 86b from the lower face of each of partition sections 86c located between the holes 86a, 86b to thus perform these positionings in a lateral direction, and then the engaging claws 12 are inserted into the cut-raised holes 87 to be engaged with the engaging lugs 87a, thus enabling the case 10 to be firmly assembled to the cover 8 without screws.

Figure 3:
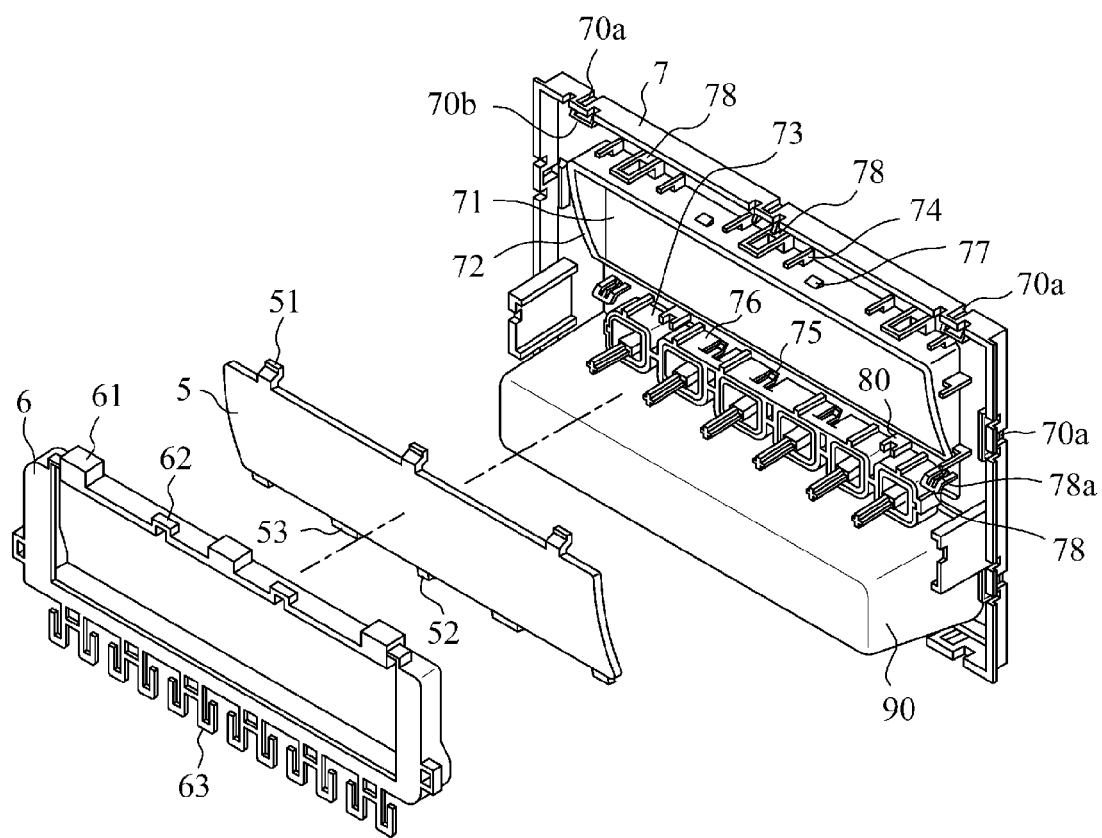
FIG. 3 is an exploded perspective view of a panel, a filter, and a hood, as is seen from the backside.
Figure 6:
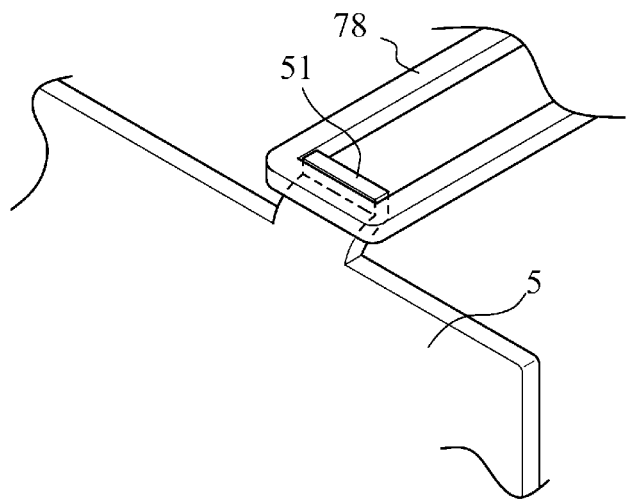
FIG. 6 is an enlarged perspective view of portion A of FIG. 4.
Figure 7:
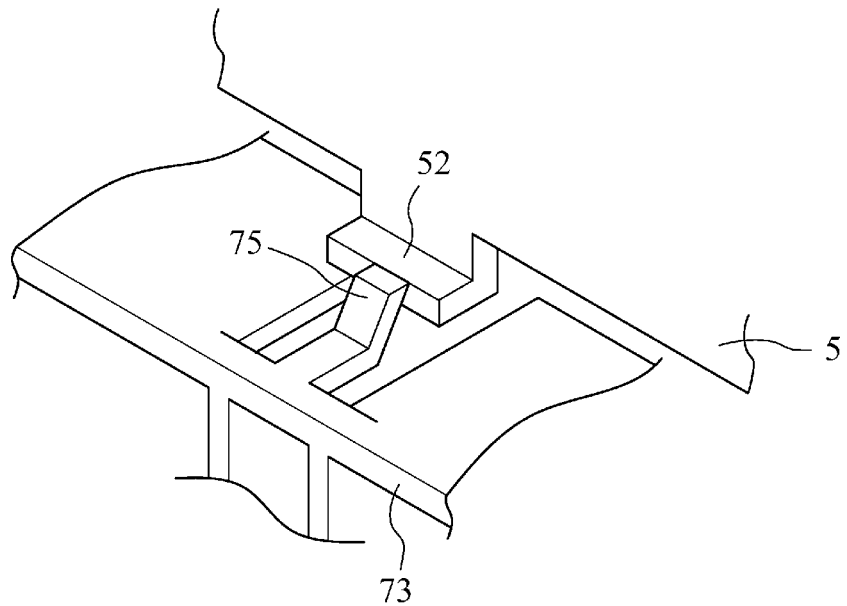
FIG. 7 is an enlarged perspective view of portion B of FIG. 4.
Figure 8:
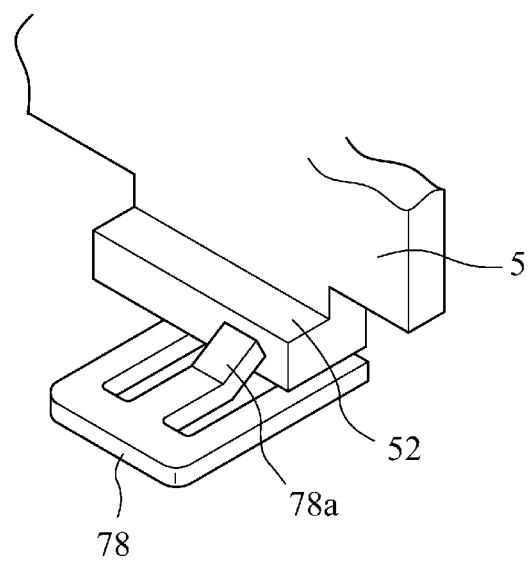
FIG. 8 is an enlarged perspective view of portion C of FIG. 4.
Figure 9:
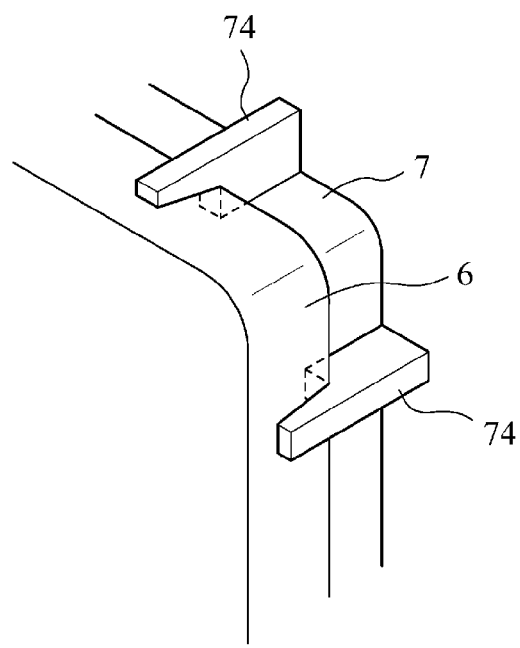
FIG. 9 is an enlarged perspective view of portion D of FIG. 5.
Figure 10:
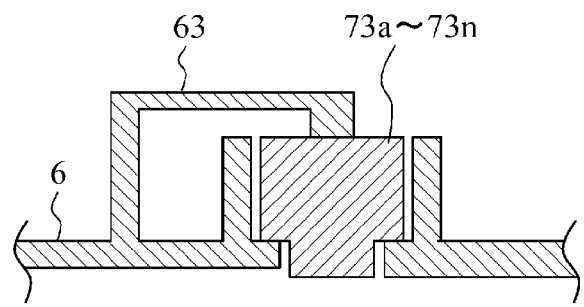
FIG. 10 is an enlarged sectional view along the line E-E of FIG. 5.
Figure 11:
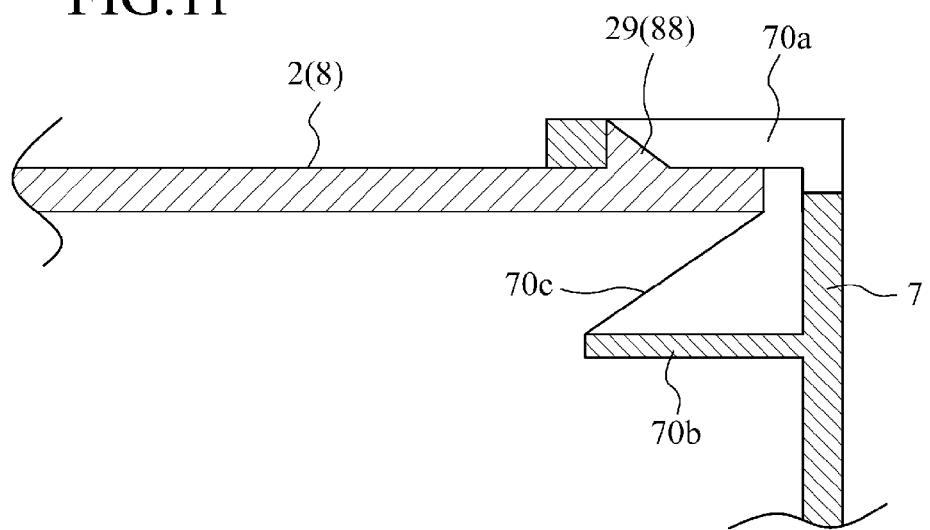
FIG. 11 is an enlarged sectional view along the line F-F of FIG. 5.
Figure 12:
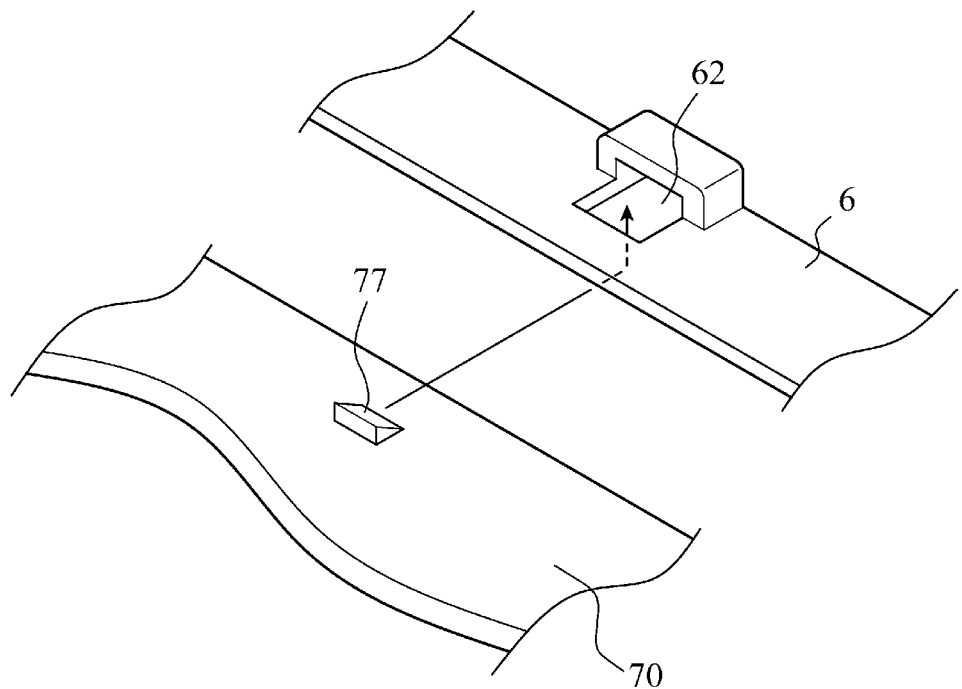
FIG. 12 is an exploded perspective view showing the relationship between an engaging hole on the side of the hood and a resiliently engaging claw on the side of the panel, as is seen from the opposite direction from that shown in FIG. 3.
Figure 13:
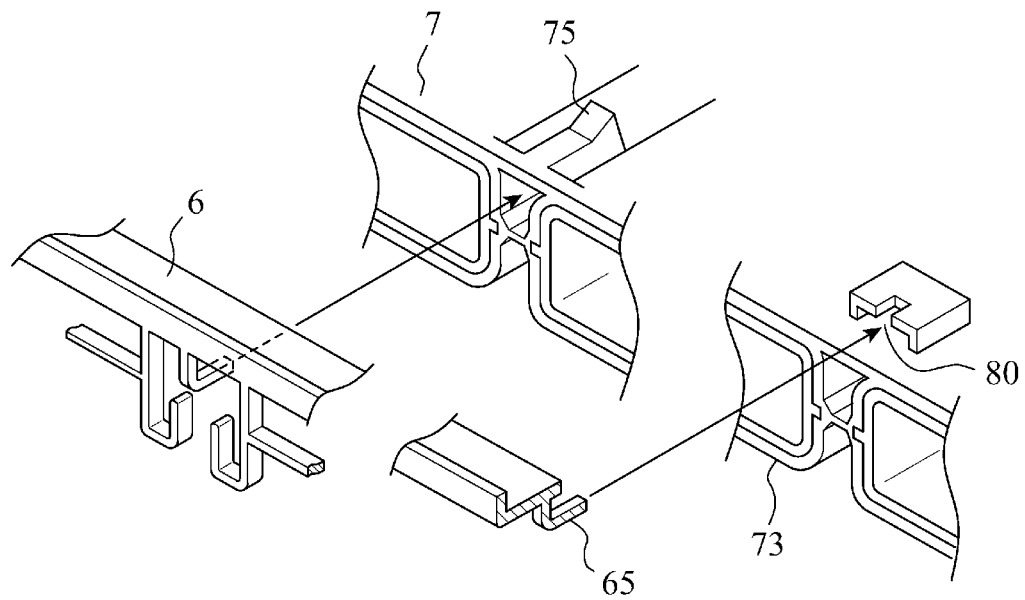
FIG. 13 is a partially exploded perspective view showing the relationship between a lower frame on the side of the hood and an operation button housing section on the side of the panel.

In the electronic apparatus thus constructed, the present invention is contrived such that the filter 5 and the hood 6 are contrived to be assembled and fixed to the panel 7 independently from each other without screws. FIG. 3 is an exploded perspective view of a panel, a filter, and a hood as is seen from the backside, FIG. 4 is a perspective view showing a state where the filter is assembled to the panel as is seen from the backside, FIG. 5 is a perspective view showing a state where the filter and the hood are assembled to the panel as is seen from the backside, FIG. 6 is an enlarged perspective view of portion A of FIG. 4, FIG. 7 is an enlarged perspective view of portion B of FIG. 4, FIG. 8 is an enlarged perspective view of portion C of FIG. 4, FIG. 9 is an enlarged perspective view of portion D of FIG. 5, FIG. 10 is an enlarged sectional view along the line E-E of FIG. 5, FIG. 11 is an enlarged sectional view along the line F-F of FIG. 5, FIG. 12 is an exploded perspective view showing the relationship between an engaging hole on the side of the hood and a resiliently engaging claw on the side of the panel as is seen from the opposite direction from that shown in FIG. 3, and FIG. 13 is a partially exploded perspective view showing the relationship between a lower frame on the side of the hood and an operation button housing section on the side of the panel.

Figure 4:
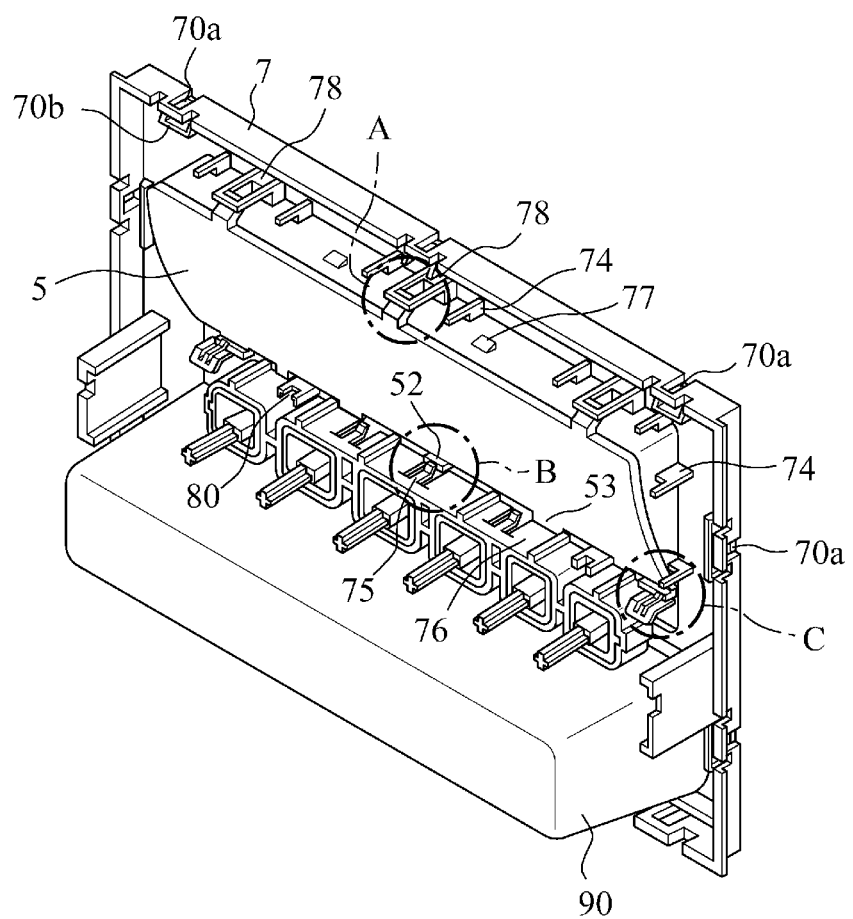
FIG. 4 is a perspective view showing a state where the filter is assembled to the panel, as is seen from the backside.
Figure 5:
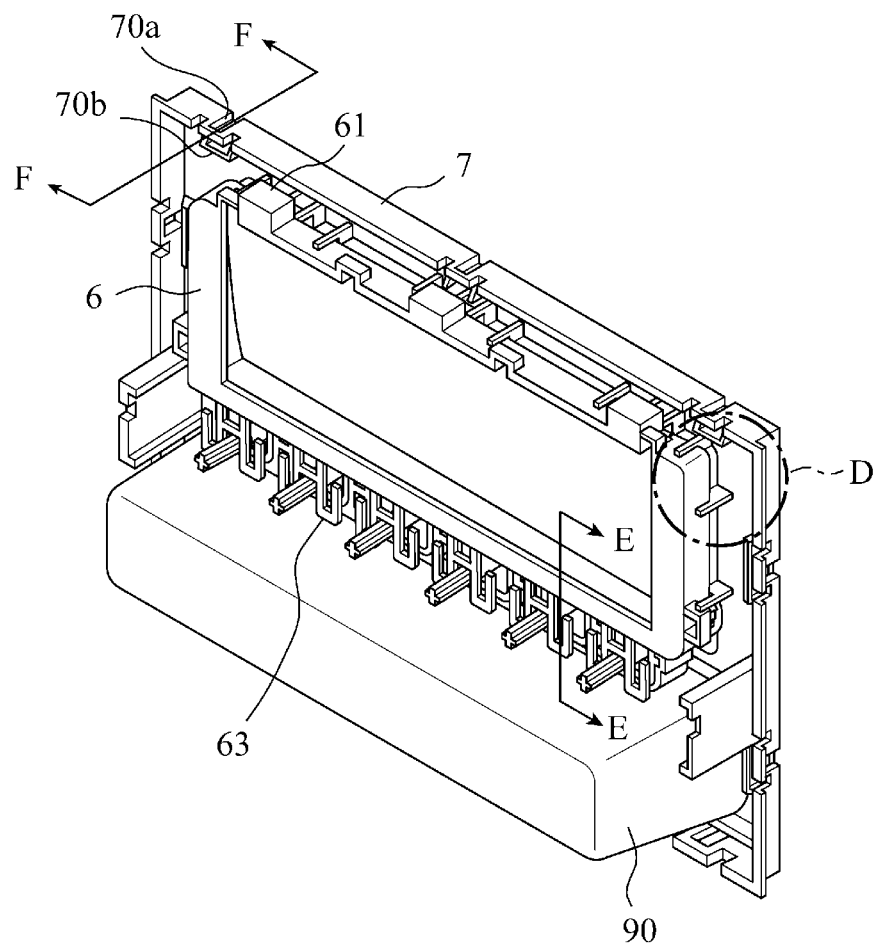
FIG. 5 is a perspective view showing a state where the filter and the hood are assembled to the panel, as is seen from the backside.

The panel 7 in the structure assembled to a panel according to the invention is made of a resin material includes the wall 70 to be assembled to the chassis 2 therearound as shown in FIG. 3 to FIG. 5, and has the display window 71 that is formed internally of the panel a predetermined distance away from a top plate of the wall 70; the filter mounting section 72 formed in the shape of a frame on the fringe of the display window 71; the operation button housing section 73 for housing the plurality of operation buttons 73a to 73n that are formed at predetermined intervals along the lower edge of the filter mounting section 72; and a glove compartment 90 that is formed positioned between the operation button housing section 73 and the lower face plate of the wall 70.

The rectangular opening engaging sections 70a for engaging with the engaging claws 29 formed on the chassis 2 and also the engaging claws 88 formed on the cover 8 are provided on the outer faces of the upper and lower face plates and the right and left face plates forming the assembling wall 70. A partition wall 70b is provided protrudingly from the panel face with opposing the rectangular opening engaging section 70a and with arranging a space in which the peripheral portion of the chassis 2 fits; an incline 70c is formed from the upper portion of each end of The partition wall 70b toward the lower portion of the rectangular opening engaging sections 70a.

Further, the resiliently engaging claws 75, the positioning concavities 76, and the engaging concavities 80 are formed on the outer face of the operation button housing section 73 that is opposite to the filter mounting section 72. Moreover, the L-shaped drawing positioning sections 74, the rectangular opening engaging sections 78, and engaging claws 79 are provided on the outer face of the top plate and on the outer face of each side face of the filter mounting section 72.

The hood 6 is made of a resin material in a frame, and has the cover sections 61 and the engaging holes 62 on the outer face of the upper frame thereof to be assembled to the outer face of the top plate of the filter mounting section 72. Further, the resiliently pressing sections 63 that are formed projecting at predetermined intervals so as to abut against the bottom faces of the operation buttons 73a to 73n are provided on the outer face of the lower frame of the hood 6, and the engaging protrusions 65 for engaging with the engaging concavities 80 are formed on the side of the hood opposed to the operation button housing section 73, as shown in FIG. 13.

The filter 5 is formed having a curved face so as to be disposed along the filter mounting section 72; the filter has at the upper end edge thereof the hookingly engaging claws 51 having a taper that are formed at predetermined intervals so as to engage with the rectangular opening engaging sections 78 of the panel 7, and has at the lower end edge thereof the resiliently engaging claws 52 and the positioning protrusions 53 formed so as to engage with the resiliently engaging claws 75 and the positioning concavities 76 formed on the outer face of the operation button housing section 73.

From the above construction, the filter 5 is first assembled to the panel 7. As shown in FIG. 6, as the hookingly engaging claw 51 of the filter 5 is engaged with the rectangular opening engaging section 78 of the panel 7 to press the side of the lower end of the filter against the side of the panel; through that process, as shown in FIG. 7 and FIG. 8, the engaging claw 52 engages with the resiliently engaging claw 75 and the resiliently engaging lug 78a of the rectangular opening engaging section 78 on the side of the panel, and also the positioning protrusion 53 engages with the positioning concavity 76 on the side of the panel to assemble the filter 5 to the panel 7 as shown in FIG. 4.

After the assembly of the filter, the peripheral portion of the hood 6 is fitted in the L-shaped drawing positioning section 74 on the side of the panel as shown in FIG. 9 such that the peripheral portion of the filter is covered, the engaging claw 77 on the side of the panel is engaged with the engaging hole 62 of the upper frame of the hood 6 as shown in FIG. 12, and the engaging protrusion 65 of the lower frame is engaged with the engaging concavity 80 as shown in FIG. 13 to assemble the hood 6 to the panel 7 as shown in FIG. 5. The assembly causes the covering section 61 to cover the rectangular opening engaging section 78 located on the side of the panel, and causes the resiliently pressing section 63 to abut against the bottom face of each of the operation buttons 73a to 73n as shown in FIG. 10 to impart a restoring force to the operation button.

As discussed above, according to the present invention, the filter and the hood are assembled to the panel independently from each other using the engagement between the protrusions and the concavities. Thus, the assembly can be performed without screws, the assembly and the disassembly can be facilitated, and the ability of those components to be recycled is enhanced. Further, even if deformation or the like is caused in the panel, since the filter and the hood are assembled to the panel independently from each other, rubbing is not caused between the filter and the hood, and the area where both of the components come in contact with each other is minimized, thus restraining the generation of grating noise thereof.

Moreover, since it is arranged that the outer face of the hood assembled to the panel is pressed by the L-shaped drawing positioning section that is formed on the outer face of the panel, the detachment between the hood and the panel is suppressed, the engagement of the engaging claws is improved, and the engagement between the hood and the panel is increased.

Furthermore, the resiliently pressing sections projecting at predetermined intervals so as to abut against the respective bottom faces of the operation buttons are formed on the outer face of the lower frame of the hood; thus, as the hood is assembled to the panel, the resiliently pressing section abuts against the lower face of the operation button housed in the operation button housing section of the panel. As a result, the operation button is normally upwardly forced by the resilient force of the resiliently pressing section to preventing the wobble of the operation button does not chatter, thereby restraining the generation of an abnormal noise.

INDUSTRIAL APPLICABILITY

The structure assembled to a panel according to the present invention has an advantageous effect such that screw fixations are reduced to thus facilitate assembly and disassembly thereof. Thus, the structure is suitable for use in an electronic apparatus or the like having an display and operation buttons.

The invention claimed is:

1. A structure assembled to a panel, comprising: the panel, a hood, and a filter,
wherein the panel includes: a filter mounting section to be mounted on the inner side thereof by the filter covering a display screen of an display; a plurality of operation button housing sections; a rectangular opening engaging section and an engaging claw formed on an outer face of a top plate of the filter mounting section; and a resiliently engaging claw, and an engaging concavity that are formed on an outer face opposing the filter mounting section of each of the operation button housing sections,
wherein the hood includes: an engaging hole for engaging with the resiliently engaging claw on the outer face of an upper frame of the filter mounting section; and an engaging protrusion for engaging with the engaging concavity in a lower frame thereof, and
wherein the filter includes: a resiliently engaging claw for engaging with the rectangular opening engaging section on the outer face of the top plate of the filter mounting section at the edge of the upper end thereof; and an engaging claw for engaging with the resiliently engaging claw of the operation button housing section at the edge of the lower end thereof.

2. The structure assembled to a panel according to claim 1, wherein the hood has a plurality of resiliently pressing sections formed projecting at predetermined intervals on the outer face of the lower frame thereof to abut against respective bottom faces of the operation buttons.

3. The structure assembled to a panel according to claim 1, wherein the panel has L-shaped drawing positioning sections each having a taper such that each of the L-shaped drawing positioning sections is wide at an inlet thereof for drawing an end portion of the assembled hood and pressing the end portion against the outer face of the filter mounting section and narrows inwardly with approach towards a bottom thereof, the L-shaped drawing positioning sections provided at predetermined intervals on the outer face of the top plate of the filter mounting section and the outer face of each side plate thereof.

4. A structure assembled to a panel, comprising: the panel, a hood, and a filter,
wherein the panel includes: a filter mounting section to be mounted on the inner side thereof by the filter having a curved surface nonparallel to a display screen of an display; a plurality of operation button housing sections provided below the filter mounting section; a rectangular opening engaging section and an engaging claw formed on an outer face of a top plate of the filter mounting section; and a resiliently engaging claw, a positioning concavity, and an engaging concavity that are formed on an outer face opposing the filter mounting section of each of the operation button housing sections,
wherein the hood includes: a cover section for covering the rectangular opening engaging section and an engaging hole for engaging with the resiliently engaging claw on an outer face of an upper frame thereof to be assembled to the outer face of the top plate of the filter mounting section; and an engaging protrusion for engaging with the engaging concavity in a lower frame thereof, and
wherein the filter is formed with a curved face to be disposed along the filter mounting section, and includes: a resiliently engaging claw for engaging with the rectangular opening engaging section on the outer face of the top plate of the filter mounting section at the edge of the upper end thereof; and an engaging claw and a positioning protrusion for engaging with the resiliently engaging claw and the positioning concavity of the operation button housing section, respectively, at the edge of the lower end thereof.

5. The structure assembled to a panel according to claim 4, wherein the hood has a plurality of resiliently pressing sections formed projecting at predetermined intervals on the outer face of the lower frame thereof to abut against respective bottom faces of the operation buttons.

6. The structure assembled to a panel according to claim 4, wherein the panel has L-shaped drawing positioning sections each having a taper such that each of the L-shaped drawing positioning sections is wide at an inlet thereof for drawing an end portion of the assembled hood and pressing the end portion against the outer face of the filter mounting section and narrows inwardly with approach towards a bottom thereof, the L-shaped drawing positioning sections provided at predetermined intervals on the outer face of the top plate of the filter mounting section and the outer face of each side plate thereof.

* * * * *